United States Patent
Laermer et al.

(10) Patent No.: US 7,855,150 B2
(45) Date of Patent: Dec. 21, 2010

(54) PLASMA SYSTEM AND METHOD FOR ANISOTROPICALLY ETCHING STRUCTURES INTO A SUBSTRATE

(75) Inventors: Franz Laermer, Weil Der Stadt (DE); Andrea Urban, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/530,612

(22) PCT Filed: Sep. 9, 2003

(86) PCT No.: PCT/DE03/02971

§ 371 (c)(1), (2), (4) Date: Dec. 30, 2005

(87) PCT Pub. No.: WO2004/036627

PCT Pub. Date: Apr. 29, 2004

(65) Prior Publication Data

US 2006/0141794 A1 Jun. 29, 2006

(30) Foreign Application Priority Data

Oct. 14, 2002 (DE) .................................. 102 47 913

(51) Int. Cl.
*H01L 21/302* (2006.01)

(52) U.S. Cl. .................. 438/706; 438/695; 438/710; 438/712; 438/714; 216/37; 216/69; 118/700; 156/345.12

(58) Field of Classification Search .................. 438/706, 438/695, 710, 712, 714, 719, 740; 216/37, 216/69; 118/715, 733, 723; 156/345.34, 156/345

See application file for complete search history.

(56) References Cited

U.S. PATENT DOCUMENTS

| 5,310,426 | A | * | 5/1994 | Mori ..................... 118/723 AN |
| 5,498,312 | A | | 3/1996 | Laermer et al. |
| 5,683,548 | A | * | 11/1997 | Hartig et al. ................. 438/729 |
| 6,051,503 | A | * | 4/2000 | Bhardwaj et al. ........... 438/705 |
| 6,071,822 | A | * | 6/2000 | Donohue et al. ............ 438/712 |
| 6,277,173 | B1 | * | 8/2001 | Sadakata et al. ............... 95/12 |

(Continued)

FOREIGN PATENT DOCUMENTS

DE 42 41 045 5/1994

(Continued)

*Primary Examiner*—Lan Vinh
*Assistant Examiner*—Maki A Angadi
(74) *Attorney, Agent, or Firm*—Kenyon & Kenyon LLP

(57) ABSTRACT

A method and a plasma system are provided for anisotropically etching structures into a substrate positioned in an etching chamber, e.g., structures defined using an etching mask in a silicon substrate, using a plasma. For this purpose, the etching chamber is supplied at least intermittently with an etching gas and at least intermittently with a passivation gas, the passivation gas being supplied to the etching chamber in cycles having a time period between 0.05 second and 1 second. In the plasma system, in addition to a plasma source, via which the plasma acting on the substrate may be produced, an arrangement is provided for at least temporary supply of the etching gas and at least temporary supply of the passivation gas to the etching chamber, which arrangement is designed in such a way that the passivation gas may be supplied to the etching chamber in cycles having a time period between 0.05 second and 1 second.

18 Claims, 1 Drawing Sheet

U.S. PATENT DOCUMENTS

| | | | |
|---|---|---|---|
| 6,431,113 B1 * | 8/2002 | Puech | 118/723 I |
| 6,846,745 B1 * | 1/2005 | Papasouliotis et al. | 438/706 |
| 6,890,863 B1 * | 5/2005 | Donohoe et al. | 438/714 |
| 2002/0000422 A1 | 1/2002 | Donohoe et al. | |
| 2002/0144974 A1 | 10/2002 | Laermer et al. | |
| 2002/0148807 A1 | 10/2002 | Zhao et al. | |
| 2003/0059720 A1 * | 3/2003 | Hwang et al. | 430/311 |

FOREIGN PATENT DOCUMENTS

| | | |
|---|---|---|
| DE | 19539078 | 4/1997 |
| DE | 197 06 682 | 8/1998 |
| DE | 197 36 370 | 3/1999 |
| DE | 19736370 | 3/1999 |
| DE | 199 27 806 | 1/2001 |
| DE | 199 33 841 | 2/2001 |
| DE | 199 33 842 | 2/2001 |
| DE | 198 26 382 | 2/2002 |
| DE | 100 51 831 | 5/2002 |
| EP | 0 849 766 | 6/1998 |
| JP | 5267226 | 10/1993 |
| JP | 6314660 | 11/1994 |
| JP | 10144654 | 5/1998 |
| JP | 11513774 | 11/1999 |
| JP | 2000323454 | 11/2000 |
| JP | 2001505001 | 4/2001 |
| JP | 2001127049 | 5/2001 |
| JP | 2003246023 | 9/2003 |
| WO | WO 00/79579 | 12/2000 |

* cited by examiner

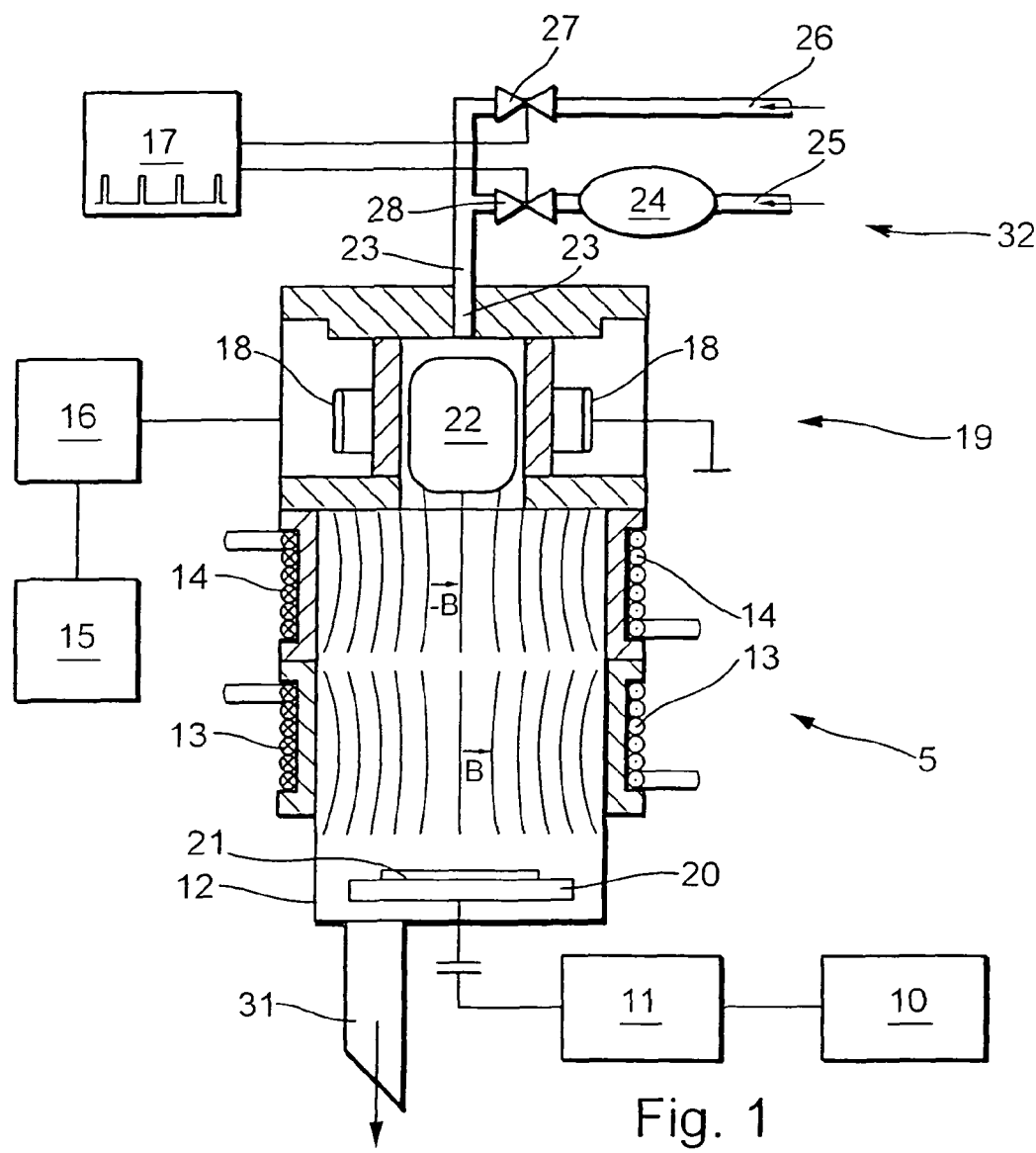
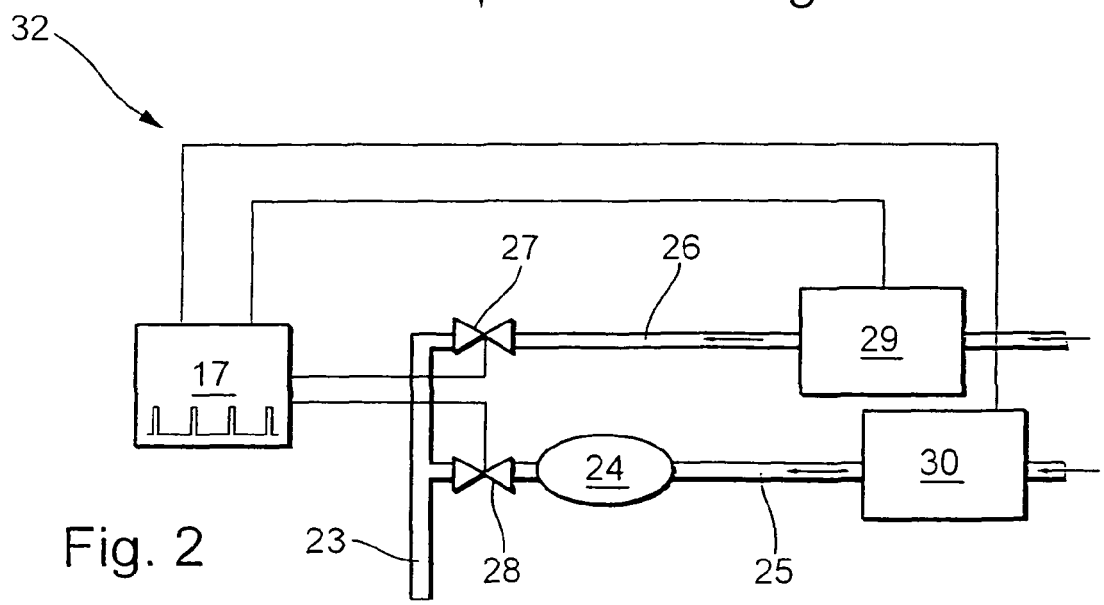
Fig. 1
Fig. 2

PLASMA SYSTEM AND METHOD FOR ANISOTROPICALLY ETCHING STRUCTURES INTO A SUBSTRATE

FIELD OF THE INVENTION

The present invention relates to a plasma system and a method for anisotropically etching structures, in particular structures defined using an etching mask, into a silicon substrate, using a plasma, according to the definition of the species in the independent claims.

BACKGROUND INFORMATION

A method for high-rate plasma etching of silicon is described, e.g., in published German patent document DE 42 41.045, etching being alternated with deposition of a Teflon-like polymer on the side walls of etched structures, which protects these walls from an etching operation during the subsequent etching steps. Gases which provide fluorine radicals in plasma, such as $SF_6$, $NF_3$, or $ClF_3$, are used as the etching gases. Gases which provide Teflon-forming monomers in plasma, such as $C_4F_8$ or $C_3F_6$, are used as the passivation gases. This method allows etching rates of up to 20 μm/minute with excellent structure precision and selectivity even in regard to simple mask materials such as photoresist or $SiO_2$.

In the method described in published German patent document DE 42 41 045, comparatively short deposition steps and/or passivation gas steps and longer lasting etching steps are used in order to achieve the highest possible etching rate. Formulas in which passivation gas steps of 3 to 5 seconds each and etching steps of 10 to 12 seconds each alternate with one another are typically used in connection with inductively coupled plasma sources. In the case of shorter passivation gas steps, it becomes increasingly more difficult to reproduce them with the required precision over a very large number of cycles.

An object of the present invention is to provide a plasma system and a method which make it possible to achieve a higher etching rate when anisotropically etching silicon as the substrate, in comparison to the prior art, while simultaneously providing greater profile control and also greater mask selectivity.

SUMMARY

The method and the plasma system according to the present invention have the advantage of a higher etching rate, e.g., when anisotropically etching silicon as a substrate, while simultaneously providing greater profile control and additionally greater mask selectivity.

It is advantageous that the achievable etching rate and the structure precision increasingly improve with shorter cycle times of the passivation gas cycles, so that the very short passivation gas cycles used according to the present invention approach an "optimum" process in which no interruptions by passivation gas use and/or no passivation steps are necessary at all; instead, etching is performed uninterrupted. However, such an "optimum" process would lead to undesired isotropic etching instead of anisotropic etching, while the process according to the present invention, in spite of the short passivation gas cycles, still allows anisotropic etching of structures.

The plasma system and the method according to the present invention thus allow extensive approximation of an "optimum process" while maintaining the anisotropy of the etching and high profile control and mask selectivity.

Furthermore, the plasma system according to the present invention has the advantage that it may be built on a typical plasma system having an inductively coupled plasma source, for example, so that no significant system investments are necessary and/or existing plasma systems may be appropriately retrofitted without significant additional expenditure.

It is advantageous that the method according to the present invention may be implemented through improvement of the method for anisotropic etching of silicon according to published German patent document DE 42 41 045 or may be integrated therein, and thereby nearly uninterrupted plasma etching, which is distinguished by particularly high etching rates with particularly good structure precision and minimal undercuts or wall roughness, is achievable in this case.

Furthermore, it is advantageous if, in the method according to the present invention based on an improvement of the method according to published German patent document DE 42 41 045, a passivation gas which provides the strongest possible passivation and Teflon-forming monomers is used as the passivation gas. In addition to $C_4F_8$ or $C_3F_6$, hydrofluorocarbons having an even lower fluorine to carbon ratio, such as $C_4F_6$ (hexafluoro-1,3-butadiene) or $C_5F_8$ (octafluoro-1,3-pentadiene), and even $C_2H_2F_2$ (difluoroethylene), are suitable for this purpose. $C_4F_6$, which forms polymers particularly efficiently, is particularly advantageous. These gases may be removed from the buffer tank during the passivation steps with gas flow and/or material quantity which is reduced in relation to $C_4F_8$ or $C_3F_6$.

With the passivation gases $C_4F_6$ or $C_5F_8$, as well as with the gases $C_4F_8$ or $C_3F_6$, a more rapid polymer deposition from the plasma advantageously occurs overall with otherwise comparable plasma characteristic data, the deposited polymer additionally being denser and, due to the lower fluorine to carbon ratio of these gases, also significantly more strongly cross-linked. In addition, the deposited polymer is more resistant to etching erosion because of a higher carbon content.

When anisotropically etching silicon as described in published German patent document DE 42 41 045, for example, in addition to the fluorine radical concentration available in the etching step, the efficiency of the buildup of a side wall polymer film as a protective film and its resistance in the following etching step play a decisive role in the process performance, and hence significant improvement potential results directly therefrom.

In particular, the improved properties of the polymer deposited as a side wall film in the passivation steps in regard to density, cross-linking, higher carbon content, and increased resistance to etching erosion allow significantly shorter passivation gas cycle times of well below 1 second, for example, 100 ms to 500 ms, and also comparatively significantly lengthened etching gas cycle times from approximately 1 second up to 20 seconds to 30 seconds, i.e., the ratio of etching time to passivation time shifts significantly in favor of the etching time to values of 10:1 to 30:1 or even more. The higher chronological proportion of the etching steps in the total process time leads directly to correspondingly higher etching rates.

Additional factors contributing to higher etching rates are the high carbon content of the side wall polymer films, their stronger cross-linking, and therefore greater resistance to erosion.

Since, because of the very short passivation gas cycle times and the used passivation gases $C_4F_6$ or $C_5F_8$ or $C_2H_2F_2$, less side wall polymer material, in comparison with the passivation gases $C_4F_8$ or $C_3F_6$ is initially eroded during the etching steps, which are isotropic per se, and redeposited in lower-lying regions of the resulting structures and/or the side walls of the resulting trenches of the etching step, but because of the higher resistance of the produced Teflon-like side wall polymer films, a sufficient local passivation effect and local anisotropy of the etching step connected therewith are still achieved, so that less fluorine is lost through interaction with polymer materials and/or passivation gas components transported by ions during the etching process. The achieved stronger C—C cross-linking also helps in this case, since fluorine radicals attack internal C—C bonds less than free external C bonds. This also increases the efficiency of the overall etching process.

The dynamics of the side wall polymer are known to have a large influence on the net quantity of available free fluorine radicals. A higher fluorine radical concentration, which is active in relation to silicon, together with greater permissible etching cycle durations and/or etching gas cycle times in relation to the passivation cycle durations and/or the passivation gas cycle times, thus significantly increase the achievable etching rates.

Finally, the mask selectivity is advantageously improved in accordance with the present invention in that the passivation coatings deposited on the mask used are also more resistant than in the known art due to the mechanisms described, and therefore the substrate masking, e.g., the masking of a silicon wafer, is passivated particularly effectively during the etching process, in the case of a photoresist mask, for example.

BRIEF DESCRIPTION OF THE DRAWINGS

FIG. 1 shows a schematic diagram of a plasma system according to a first exemplary embodiment.

FIG. 2 shows a detailed illustration of a modified gas supply controller according to a second exemplary embodiment.

DETAILED DESCRIPTION

FIG. 1 shows a plasma system 5 having an etching chamber 12 and a plasma source 19. In particular, an ion discriminator is located below plasma source 19 and has two coils which have a current flowing through them in opposite directions during operation, an upper coil 14 and a lower coil 13, and a drift zone, which is provided by a "spacer" or a spacer ring, for propagation of a plasma 22, produced in etching chamber 12 in the region of plasma source 19, in the direction of a substrate 21, such as a silicon wafer, which is located on a substrate electrode 20. Furthermore, substrate electrode 20 is connected via a first impedance matching device 11 (first "matchbox") to a substrate bias generator 10. Plasma source 19 is an inductively coupled plasma source having a coil 18, which is connected via a second impedance matching device (second "matchbox") to a coil generator 15. Finally, the etching chamber has a high-performance pump device 31, via which etching chamber 12 may be evacuated.

Plasma system 5 according to the present invention has a modified gas supply device 32 of etching chamber 12. A feed line 23 is provided for this purpose, which is as short as possible, e.g., not longer than 20 cm, and which discharges into etching chamber 12, and is connected to an etching gas line 26 and a separate, independent passivation gas line 25. Furthermore, an etching gas valve 27 is provided upstream from the discharge of etching gas line 26 into feed line 23, and a passivation-gas valve 28 is provided upstream from the discharge of passivation gas line 25 into feed line 23. Finally, a buffer tank 24 is inserted into passivation gas line 25 upstream from passivation gas valve 28. In addition, a buffer tank (not shown in FIG. 1), which buffers the etching gas supply during the passivation gas cycles, i.e., when etching gas valve 27 is closed, may be provided in etching gas line 26 upstream from etching gas valve 27.

Valves 27, 28 may be positioned as close as possible to etching chamber 12, i.e., the gas lines which follow subsequent valves 27, 28 are as short as possible. Furthermore, buffer tank 24 is also to be positioned directly upstream from passivation gas valve 28. In addition, feed line 23 may be dispensed with completely if etching gas line 26 and passivation gas line 25 discharge directly into etching chamber 12 via two assigned inlet openings. In this case, valves 27, 28 may be each located directly upstream from these inlet openings on etching chamber 12.

Finally, a programmable control unit 17, via which valves 27, 28 may be actuated, is provided in FIG. 1. In addition, two mass flow regulators (not shown in FIG. 1) are provided, which are positioned upstream from valves 27 and 28, respectively, and are assigned to etching gas line 26 and passivation gas line 25, respectively, or are integrated therein. Control unit 17 may also be connected to these mass flow regulators, as is explained in FIG. 2 in connection with a second exemplary embodiment. In this case, etching gas line 26 is assigned a first mass flow regulator 29 and passivation gas line 27 is assigned a second mass flow regulator 30, which again may be positioned as close as possible to etching chamber 12. Alternatively, it is also possible to place mass flow regulators 29, 30 distal from etching chamber 12, in a "gas box," for example.

Control unit 17 may be integrated into the process sequence controller of plasma system 5 as a hardware component or may be a part of the process sequence controller, i.e., the software code, for example.

Buffer tank 24 may have a volume from 0.1 L to 1 L, for example, 0.5 L, and may be made of stainless steel having electropolished internal walls. If a buffer tank is also provided in etching gas line 26 upstream from etching gas valve 27, it also has an analogous design.

Etching gas valve 27 is designed as a "normally open" valve during operation of plasma system 5, while passivation gas valve 28 is designed as a "normally closed" valve. Valves 27, 28 discharge, as explained, as directly as possible into etching chamber 12, and either separate short gas lines having the largest possible cross section and a length of at most 20 cm, or shared short feed line 23, also having the largest possible cross section, may be provided for the outlets of etching gas valve 27 and passivation gas valve 28. The connection of buffer tank 24 to passivation gas valve 28 is also to have a length of less than 20 cm and is to be designed to have the largest possible cross section. In addition, it is possible to combine etching gas valve 27 and passivation gas valve 28 into a single changeover valve, which connects etching gas line 26 in the rest state and passivation gas line 25 in the activated state through to etching chamber 12. This results in synchronization of the opening and closing operations for lines 25, 26 in a simple way.

Using plasma system 5, structures which are defined laterally with the aid of an etching mask are anisotropically etched in silicon, i.e., substrate 21, according to published German patent document DE 41 42 045, $C_4F_6$ being used as the passivation gas, for example. For this purpose, valves 27, 28 are alternately opened and closed. Passivation gas valve 28 and etching gas valve 27 are preferably rapidly switching valves, solenoid valves, for example, which may be activated directly using a 24 V signal, for example, and have switching times in the range of tens of milliseconds. If 24 V are applied in this case, etching gas valve 27 closes and shuts off the etching gas conducted in etching gas line 26 from etching chamber 12, while passivation gas valve 28 opens and releases the passivation gas conducted in passivation gas line 25 to etching chamber 12. Correspondingly, a changeover valve switches the etching chamber from etching gas to passivation gas, i.e., to buffer tank 24, when 24 V voltage is applied. Alternatively, pneumatic valves having electrical pilot valves are also conceivable for valves 27, 28, but a slower response would result.

When plasma system 5 is operated in accordance with an etching method as described in published German patent document DE 42 41 045, for example, an etching gas flow of 300 to 1000 sccm $SF_6$, e.g., 500 sccm $SF_6$, and a passivation gas flow of 10 to 500 sccm $C_4F_6$, e.g., 50 sccm to 200 sccm $C_4F_6$ (sccm=$cm^3$/minute at normal pressure) are used. The power used at inductive plasma source 19 is from 2000 watts to 5500 watts.

As shown in FIG. 2, mass low regulators 29, 30 assigned to etching gas line 26 and the passivation gas line 25, respectively, are each set to a fixed gas flow, for example, 500 sccm $SF_6$ and 100 sccm $C_4F_6$, in a variation of the method according to the present invention. The etching gas $SF_6$ first flows via open valve 27 into etching chamber 12, while the passivation gas $C_4F_6$ first fills buffer tank 24 and is prevented from flowing into etching chamber 12 by closed valve 28. After 5 seconds, for example, a short pulse is then sent to both valves 27, 28 by control unit 17, so that valve 27 closes and blocks the further flow of the etching gas into etching chamber 12 for a short period of time from 0.05 second to 1 second, e.g., from 0.1 seconds to 0.5 seconds, while passivation gas valve 28 opens for this period of time and releases the pathway of the passivation gas into etching chamber 12, so that buffer tank 24 empties nearly instantaneously into etching chamber 12. After the preselected cycle time of 0.05 second to 1 second, for example, 0.3 second, has elapsed, valve 27 is opened again and valve 28 is accordingly closed again by appropriate electrical signals from control unit 17, i.e., the etching gas again flows into etching chamber 12 and the passivation gas again fills buffer tank 24 until the described switching cycle repeats after a further 5 seconds. 1 second to 15 seconds, e.g., 2 seconds to 7 seconds, is set as the time interval between the passivation gas cycles, i.e., as the time duration of the etching gas cycles.

Overall, etching is performed the great majority of the time in this way and the etching procedure is only interrupted during the very short passivation gas cycles and a surge of passivation gas is fed to plasma source 19, so that a thin layer of Teflon passivation is laid over all etched structures and also provides the necessary side wall passivation for the subsequent etching step.

In the method described above in connection with FIG. 2, mass flow regulators 29, 30 operate continuously. The brief interruption of the access to etching chamber 12 is not significant in this case for the etching gas flow and/or it may be captured as needed by the additional buffer tank described for the etching gas. The passivation gas flows continuously from second mass flow regulator 30 into buffer tank 24, which empties periodically into etching chamber 12 during the very short passivation gas cycles. The amount of passivation gas accumulated in buffer tank 24 before passivation gas valve 28 is opened thus determines the amount of side wall passivation which is incorporated in the etching process. For a time interval $t_1$ between the individual passivation gas cycles, which is synonymous with the time period of the etching cycles or the etching gas cycles in the above-described method, the material quantity of the passivation gas accumulated in buffer tank 24 is equal to the product of gas flow and this time $t_1$.

In a second variation of the method according to the present invention, second mass flow regulator 30 is additionally cycled in synchronization with the control of valves 27, 28 via control unit 17 according to FIG. 2. This avoids the difficulty or disadvantage of the material quantity of the passivation gas which reaches etching chamber 12 during the passivation gas cycles being scaled directly with the time interval of the passivation gas cycles, which corresponds to the etching step duration, so that every change of the etching step duration or the etching gas cycle time also results in a change of the accumulated passivation gas quantity in buffer tank 24.

For example, if the time interval between the passivation gas cycles, i.e., the etching step duration, is halved, the time during which buffer tank 24 is filled with passivation gas is correspondingly also halved. In order to correct this halved charging time, the passivation gas flow to be provided by second mass flow regulator 30 must then be doubled in the process program via control unit 17.

This coupling of etching step duration or etching gas cycle time $t_2$ and time interval $t_1$ of the individual passivation gas cycles, which results in a comparatively complex process adaptation for the individual case, is avoided in that second mass flow regulator 30 is switched to be active via control unit 17 only for a tank charging time $t_L$, which is shorter than etching step duration $t_2$. For this purpose, after the etching gas flow is reintroduced into etching chamber 12, second mass flow regulator 30 is switched off for a time span $t_2-t_L$, i.e., the requested passivation gas flow is set to 0 during this time. Second mass flow regulator 30 is again set to its setpoint gas flow until the end of the following passivation gas cycle and/or the beginning of the following etching gas cycle only after waiting time $t_2-t_L$ has elapsed after the beginning of the etching step. In this case, for example, the values $t_2=5$ seconds, $t_L=^2$ seconds, and the passivation gas flow 200 sccm are selected.

However, this method also has the disadvantage that during the passivation gas cycles, not only the contents of buffer tank 24 flow into etching chamber 12, but a small amount of passivation gas is also subsequently supplied by second mass flow regulator 30 during the passivation gas cycle. Although the passivation gas cycle is short and this quantity is correspondingly small, the response behavior of passivation gas valve 28 is transferred into the process.

In a third variation of the method according to the present invention, second mass flow regulator 30 is therefore controlled by control unit 17 so that the passivation gas flow is only regulated up to its setpoint value after passivation gas valve 28 is closed and remains there for tank charging time $t_L$, which is less than etching step duration $t_2$ or the time $t_1$ between passivation gas cycles, but is regulated back down to 0 for remaining time $t_2$ or $t_1$ after $t_L$ has passed. In this case, $t_L$ is always less than $t_1$ or $t_2$. The amount of passivation gas which flowed into buffer tank 24 during time span $t_L$ thus remains trapped until passivation gas valve 28 is opened briefly and the stored passivation gas amount may flow over into etching chamber 12. During this time, second mass flow regulator 30 is still regulated to 0 and thus may not subsequently supply passivation gas. The supplied material quantity of passivation gas may be set particularly precisely with this method control and is determined independently of the switching behavior of passivation gas valve 28, which makes setting the process easier.

In a fourth variation of the method according to the present invention, at least one of the parameters selected from etching step duration $t_2$, tank charging time $t_L$, etching gas flow, passivation gas flow, and a substrate bias power coupled into substrate 21 via substrate electrode 20 is varied as a function of time so that the process first starts with a high proportion of passivation and the amount of deposited polymer is reduced continuously or in discrete steps during the process.

Although the above-described methods are independent of the details of a specific plasma source 19 per se, specific boundary conditions are to be taken into consideration. Thus, gas pulse operation, in which a significant material quantity of a gas suddenly flows into plasma source 19 to replace another gas, results in a sudden pressure increase and altered plasma conditions, e.g., n regard to the gas types and their electronegativity.

In addition, for a method according to published German patent document DE 42 41 045, it is important for plasma 22 always to remain stable and well "matched" via second impedance matching device 16, i.e., for it not to go out or blink if possible. This requires a plasma source 19 which is tolerant to process fluctuations. An inductively coupled plasma source 19 having a high coupled high-frequency power of 3000 watts to 5500 watts and an etching chamber having the smallest possible internal diameter of only 5 cm to 20 cm, e.g., 9 cm to 15 cm, may be used. The power per area in the region of plasma source 19 or at the location of substrate 21 is increased in this way by more than one order of magnitude to values of more than 5 watts/cm$^2$, e.g., 20 watts/cm$^2$ to 30 watts/cm$^2$. A plasma 22 of this type is particularly tolerant to process parameter fluctuations.

In order not to impair the uniformity of the etching results over the surface of substrate 21 in this case in spite of diminished etching chamber 12, it is very advantageous to use the magnetic ion discriminator, e.g., as described in published German patent document DE 100 51 831, in combination with a drift zone in plasma system 5. This results in homogenization of the distribution of the neutral radicals from plasma 22 on their pathway from plasma source 19 toward substrate 21, while the magnetic ion discriminator ensures homogenization and/or focusing of the ion beam to substrate 21 and reflection of electrons. In addition, the magnetic fields generated via lower coil 13 and upper coil 14 also transfer to plasma source 19 and cause increased electron density in plasma 22, which is accordingly more robust and tolerant to sudden changes of essential gas parameters such as pressure, gas flow, gas type, and electronegativity.

As an alternative to the variations of the method described above, the use of valves which change over alternately between supplying etching gas and passivation gas to etching chamber 12 and a bypass line to a fore-vacuum pump (not shown in FIG. 1) may also be implemented. This does allow the desired shorter cycle times, since then the regulating speed of mass flow regulators 29, 30 is no longer decisive for the cycle times, but rather the closing times of the valves. However, this procedure has the disadvantage that a significant proportion of the costly process gases are lost unused and must be disposed of as exhaust gas. This is true in particular for the passivation gas, which must be supplied to etching chamber 12 only for the shortest possible time, but advantageously with a correspondingly large gas flow, and during the remaining time, i.e., the etching step duration and/or during the following etching gas cycle, flows out unused via the bypass line. This method is thus possible, but is comparatively costly.

What is claimed is:

1. A method for anisotropically etching structures into a substrate positioned in an etching chamber, comprising:
    providing an etching mask on a silicon substrate positioned in the etching chamber; and
    providing the etching chamber at least intermittently with an etching gas and at least intermittently with a passivation gas;
    wherein the passivation gas is supplied to the etching chamber in cycles each having a time period between 0.05 second and 1 second;
    wherein the etching gas and the passivation gas are used alternately during separate etching steps and passivation steps that are controlled independently of one another, the passivation gas being supplied to the etching chamber substantially only during the passivation steps, and the etching gas being supplied to the etching chamber substantially only during the etching steps; and the duration of the passivation steps is set to be shorter than the duration of the etching steps by a factor of 10 to 30;
    wherein a passivation gas line is provided upstream from the etching chamber, a buffer tank is located along the passivation gas line upstream from the etching chamber, a passivation gas valve is located downstream from the buffer tank and upstream from the etching chamber, and an etching gas line is provided upstream from the etching chamber;
    wherein the passivation gas line and the etching gas line one of: a) connect directly into the etching chamber; and b) connect directly into a common feed line upstream from the etching chamber, wherein the common feed line feeds into the etching chamber;
    wherein all of the passivation gas supplied to the etching chamber passes through the passivation gas line and the buffer tank; and
    wherein during the etching steps, the buffer tank is filled with passivation gas, and during the passivation steps, the buffer tank is emptied and the passivation gas formerly in the buffer tank flows into the etching chamber.

2. The method as recited in claim 1, wherein the cycles have an identical time period between 0.1 second and 0.5 second.

3. The method as recited in claim 1, wherein the etching gas is also supplied to the etching chamber in cycles each having a time period between 1 second and 15 seconds.

4. The method as recited in claim 3, wherein the anisotropic etching is performed in separate, sequentially alternating etching and passivation steps, and wherein a Teflon®-like polymer is applied to at least one lateral delimitation of the etched structures with the aid of the passivation gas during the passivation steps, the polymer being at least partially eroded during the etching steps following the passivation steps and being redeposited in lower regions of the etched structures.

5. The method as recited in claim 3, wherein a high-density plasma having at least $10^{12}$ reactive species/cm$^3$ is provided for the etching steps, and wherein pulsed ion bombardment of the substrate having an ion energy from 1 eV to 100 eV in one of continuous wave operation and averaged over time is performed at least intermittently during the etching steps.

6. The method as recited in claim 1, wherein the passivation gas includes at least one of $C_4F_8$, $C_3F_6$, $C_4F_6$, $C_5F_8$, and $C_2H_2F_2$.

7. The method as recited in claim 1, wherein the amount of the passivation gas used during each of the individual passivation steps is reduced one of continuously and in steps as etching progresses.

8. The method as recited in claim 1, wherein the common feed line has a length of less than 20 cm.

9. A plasma system for anisotropically etching structures into a substrate, comprising:
- an etching chamber for accommodating the substrate, wherein the substrate is positioned on a substrate electrode located within the etching chamber;
- a plasma source for producing a plasma acting on the substrate; and
- a supply arrangement for at least intermittently supplying an etching gas and at least intermittently supplying a passivation gas to the etching chamber;
- a passivation gas line provided upstream from the etching chamber;
- a buffer tank located along the passivation gas line upstream from the etching chamber;
- a passivation gas valve located downstream from the buffer tank and upstream from the etching chamber; and
- an etching gas line, wherein the passivation gas line and the etching gas line one of: a) connect directly into the etching chamber; and b) connect directly into a common feed line upstream from the etching chamber, wherein the common feed line feeds into the etching chamber;
- wherein all of the passivation gas supplied to the etching chamber passes through the passivation gas line and the buffer tank; and
- wherein during the etching steps, the buffer tank is filled with passivation gas, and during the passivation steps, the buffer tank is emptied and the passivation gas formerly in the buffer tank flows into the etching chamber.

10. The plasma system as recited in claim 9, further comprising:
- a pump device for evacuating the etching chamber;
- wherein the etching gas and the passivation gas are supplied to the etching chamber alternately during separate, independently controlled etching and passivation steps, and wherein a region of the etching chamber where the plasma source acts on the etching gas is substantially free of the passivation gas during the etching steps, and wherein a region of the etching chamber where the plasma source acts on the passivation gas is substantially free of the etching gas during the passivation steps.

11. The plasma system as recited in claim 9, wherein the etching gas line is provided with an etching gas valve for selectively interrupting a supply of the etching gas to the etching chamber before the passivation gas is supplied to the etching chamber.

12. The plasma system as recited in claim 11, wherein at least one of the etching gas valve and the passivation gas valve is positioned at a distance of less than 20 cm upstream from the etching chamber.

13. The plasma system as recited in claim 11, wherein the etching gas valve and the passivation gas valve are combined into one changeover valve for alternately connecting the etching gas line and the passivation gas line to the etching chamber.

14. The plasma system as recited in claim 11, wherein the etching gas and the passivation gas are used alternately during separate etching steps and passivation steps that are controlled independently of one another, the passivation gas being supplied to the etching chamber substantially only during the passivation steps, and the etching gas being supplied to the etching chamber substantially only during the etching steps.

15. The plasma system as recited in claim 9, wherein the buffer tank has a volume of 0.1 L to 1 L.

16. The plasma system as recited in claim 9,
- wherein the plasma source is an inductively coupled plasma source, and
- wherein the etching chamber has an internal diameter of 5 cm to 20 cm at least in a region near the plasma source, whereby when the plasma source is powered by a high-voltage generator, a power per area of more than 5 watts/$cm^2$ is provided inside the etching chamber in one of the region near the plasma source and at a location of the substrate.

17. The plasma system as recited in claim 9, further comprising:
- at least two coils externally enclosing the etching chamber and positioned one above the other, the two coils having current flows in opposite directions, wherein the at least two coils are provided between the plasma source and the substrate.

18. The plasma system as recited in claim 9, wherein the common feed line has a length of less than 20 cm.

* * * * *